United States Patent
Wu et al.

(10) Patent No.: US 8,987,845 B2
(45) Date of Patent: Mar. 24, 2015

(54) METHOD FOR THE PREVENTION OF SUSPENDED SILICON STRUCTURE ETCHING DURING REACTIVE ION ETCHING

(71) Applicant: Taiwan Semiconductor Manufacturing Co. Ltd., Hsin-Chu (TW)

(72) Inventors: Ting-Hau Wu, Yilan (TW); Kuei-Sung Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 13/673,223

(22) Filed: Nov. 9, 2012

(65) Prior Publication Data

US 2014/0131818 A1    May 15, 2014

(51) Int. Cl.
  *H01L 29/84*    (2006.01)
  *H01L 27/14*    (2006.01)
  *G01L 9/00*    (2006.01)
  *H04R 23/00*    (2006.01)
  *H01L 41/332*    (2013.01)
  *B81B 3/00*    (2006.01)
  *B81C 1/00*    (2006.01)

(52) U.S. Cl.
  CPC ............ *H01L 41/332* (2013.01); *B81B 3/0018* (2013.01); *B81C 1/00595* (2013.01)
  USPC ............ 257/419; 257/414; 257/415; 257/418

(58) Field of Classification Search
  USPC .................. 257/414, 415, 418, 419
  See application file for complete search history.

(56) References Cited

U.S. PATENT DOCUMENTS

| | | | |
|---|---|---|---|
| 7,128,843 B2 * | 10/2006 | Mehta ................ | 216/2 |
| 7,578,189 B1 * | 8/2009 | Mehregany ............... | 73/514.18 |
| 7,785,913 B2 * | 8/2010 | Foster et al. .............. | 438/53 |
| 8,470,628 B2 * | 6/2013 | Guillorn et al. ............. | 438/48 |
| 2010/0043546 A1 * | 2/2010 | Kandori et al. ........... | 73/504.12 |
| 2011/0012211 A1 * | 1/2011 | Merz et al. .................... | 257/415 |
| 2011/0156106 A1 * | 6/2011 | Lee et al. .................... | 257/254 |
| 2013/0285171 A1 * | 10/2013 | Najafi et al. ................ | 257/415 |
| 2014/0151823 A1 * | 6/2014 | Chou ............................ | 257/415 |

OTHER PUBLICATIONS

Said Emre Alper, et al., "A Compact Angular Rate Sensor System Using a Fully Decoupled Silicon-on-Glass MEMS Gyroscope"; Journal of Microelectromechanical Systems, vol. 17, No. 6, Dec. 2008, p. 1418-1429.

* cited by examiner

*Primary Examiner* — Victor A Mandala
(74) *Attorney, Agent, or Firm* — Eschweiler & Associates, LLC

(57) ABSTRACT

The present disclosure is directed to a device and its method of manufacture in which a protective region is formed below a suspended body. The protective region allows deep reactive ion etching of a bulk silicon body to form a MEMS device without encountering the various problems presented by damage to the silicon caused by backscattering of oxide during overetching periods of DRIE processes.

20 Claims, 5 Drawing Sheets

METHOD FOR THE PREVENTION OF SUSPENDED SILICON STRUCTURE ETCHING DURING REACTIVE ION ETCHING

BACKGROUND

Micro-Electro-Mechanical Systems (MEMS) refer to the integration of mechanical elements and electronics on a semiconductor substrate through microfabrication technology. While the electronics are fabricated using integrated circuit (IC) processes, the micromechanical elements are fabricated using compatible "micromachining" processes that selectively etch away parts of the silicon wafer to form the mechanical and electromechanical devices.

DETAILED DESCRIPTION

Figure 1A:
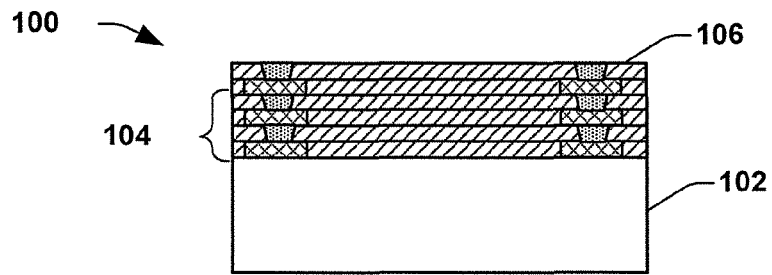
FIGS. 1A-1H are partial cross sectional views one embodiment of a device in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

MEMS have been fabricated using modified versions of the same semiconductor fabrication technology used to make electronics (e.g., CMOS transistors). These include molding and plating, wet etching (e.g., potassium hydroxide (KOH) or tetra-methyl ammonium hydroxide (TMAH)), and dry etching (e.g., reactive ion etching (RIE) and deep reactive ion etching (DRIE)), electro discharge machining (EDM), and other technologies capable of manufacturing very small devices.

For some MEMS devices, the material used for fabrication processes can be etched. Deep reactive ion etching (DRIE) is a known process capable of performing deep, high aspect ratio anisotropic etches of silicon and polysilicon, and is desirable for producing semiconductor MEMS. A difficulty of micromachining MEMS using the DRIE process has been that, even with individual etch times calculated for each semiconductor wafer, it is difficult to not overetch or underetch certain features in the wafer. Overetching a wafer typically causes significant damage to the proof mass fingers and can render the device nonfunctional, leading to a significant reduction in wafer yield. On the other hand, underetching causes undesired electrical connections that also render the device nonfunctional. Because of non-uniformities that exist in the product wafers and the highly specialized DRIE equipment, it is not unusual to have both overetched and underetched devices on wafers processed by DRIE. The fact that there can be underetched and overetched die on a wafer indicates that the DRIE process window is smaller than is desirable for producing intricate MEMS devices.

The etch lag is believed to occur with essentially any suspended feature DRIE etched from a substrate above a cavity. Consequently, though the DRIE process has the capability of performing deep, high aspect ratio anisotropic etches in silicon and polysilicon, the etch lag associated with the DRIE process complicates the ability to utilize the DRIE process in the micromachining of essentially any suspended feature (e.g., cantilever, bridge, proof mass, finger, tether, etc.) used in a wide variety of devices, such as actuators and passive circuit elements, in addition to linear and rotational motion and acceleration sensors.

Additionally, backscattering of plasma ions from a dielectric layer, such as an oxide, during overetching in the DRIE process results in damage to the bottom surface of the bulk silicon structure from which the MEMS is formed.

There is, therefore, a need in the integrated circuit manufacturing art to develop a manufacturing process that will increase the process window while allowing for DRIE of the bulk silicon forming the MEMS structure without bottom damage to the structure.

Accordingly, the present disclosure is directed to a MEMS device, such as, in one embodiment, a micro-inertial/accelerometer sensor that detects a change in position of a suspended body corresponding to an acceleration experienced by the device, and a method for its fabrication. The method provides a protective region below the bulk silicon structure from which the MEMS device is formed which prevents backscattering during overetching periods. The method thus provides a smooth silicon bottom surface, while further allowing an increased process window.

FIGS. 1A-1H illustrate a plurality of partial cross section diagrams illustrating one embodiment of a method of forming a device at stages in the manufacturing process according to the disclosure. Referring to FIG. 1A, a semiconductor substrate 102 having an interconnect structure 104 thereon is provided. Substrate 102 is understood to include a semiconductor wafer or substrate, comprised of a semiconducting material such as silicon or germanium, or a silicon on insulator structure (SOI). Semiconductor substrate can further include one or more conductive layers (such as metal or silicon) and/or insulating layers, and one or more active or passive devices formed in or over the substrate or the like. A top or upper metal layer 106 is formed overlying interconnect structure 104.

Figure 1B:
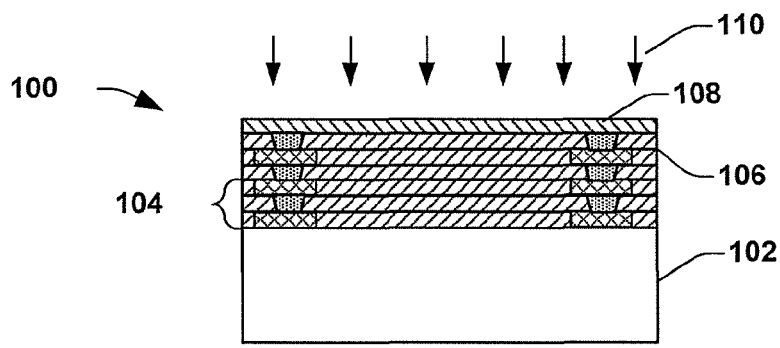
Figure 1C:
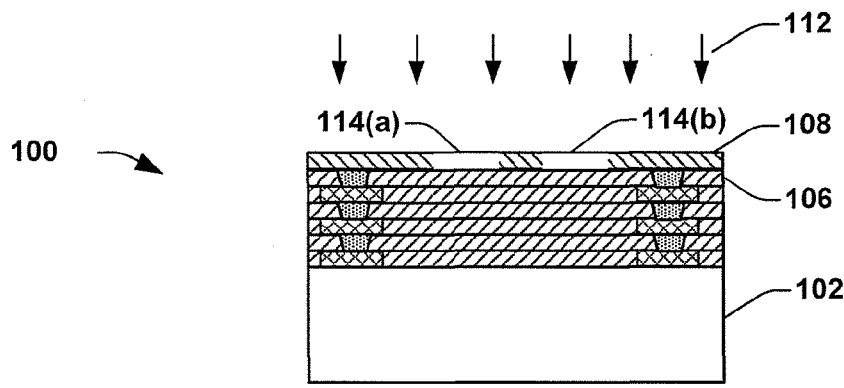

In FIG. 1B a dielectric layer 108 is formed by process 110 overlying top metal layer 106. Dielectric layer 108, in one embodiment, includes an oxide layer. It is contemplated that other types of dielectric layers may be used. Regardless of the type of dielectric layer 108 utilized, dielectric layer 108 is characterized by a first backscattering characteristic. In one embodiment, dielectric layer 108 is formed by chemical vapor deposition (CVD). In another embodiment, dielectric layer 108 may be formed by bonding, depositing, growing and thermally oxidizing, or other methods. A patterning step is then carried out to provide a mask, and in FIG. 1C, an etch process 112 is performed to form openings 114(*a*), 114(*b*) in the dielectric layer 108.

Figure 1D:
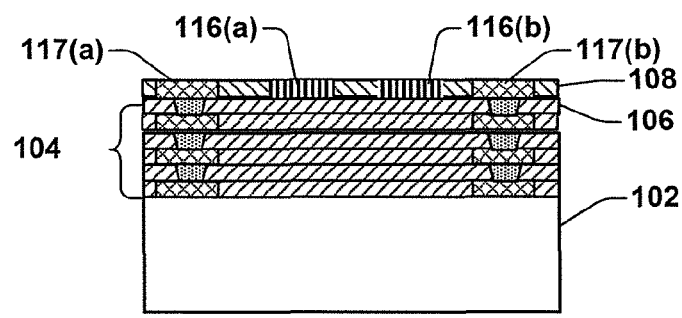

Referring to FIG. 1D, protective region 116(*a*), 116(*b*) is deposited overlying dielectric layer 108 and embedded in and filling openings 114(*a*), 114(*b*) in dielectric layer 108. In one embodiment, protective region 116(*a*), 116(*b*) includes a metal comprising one or more of Al, AlCu, Ti, TiN, TaN or Cu. The thickness of the protective region may be, in one embodiment, from about 0.4 microns to about 10 microns. In one embodiment, protective region 116(*a*), 116(*b*) is defined by a second backscattering characteristic. The second backscattering characteristic limits or reduces backscattering of plasma ions during a subsequent DRIE process, relative to the first backscattering characteristic of the dielectric layer 108. In one embodiment, a chemical mechanical polishing process (not shown) is then performed to remove protective region 116(a), 116(b) over dielectric layer 108 and leave a planarized protective region in openings 114(a), 114(b). In another embodiment, a dry etching process (not shown), may be performed to remove protective region over dielectric layer 108. In some embodiments, conductive regions 117a, 117b, which act as contacts to higher structures to be subsequently formed, can also be formed of the same metal as the protective region 116(a), 116(b) or of a different conductive material.

Figure 1E:
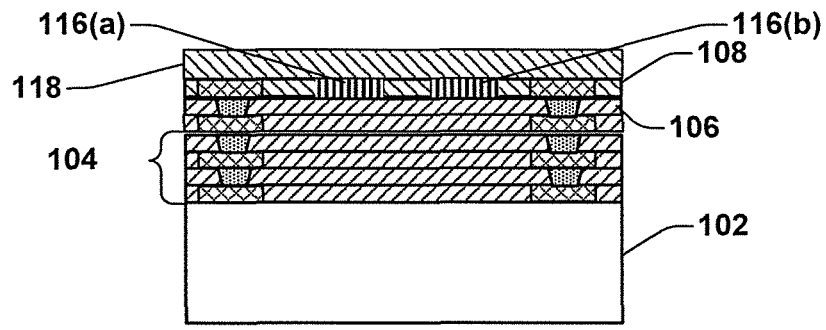
Figure 1F:
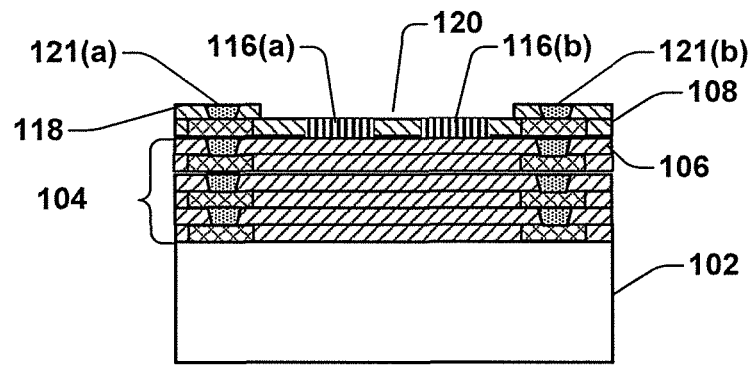

In FIG. 1E, a spacer layer 118 is formed overlying the protective region 116(a), 116(b) and dielectric layer 108. In one embodiment, the spacer layer 118 is a high density plasma oxide. In another embodiment, the spacer layer 118 is a silicon oxide ($SiO_2$) layer. In another embodiment, the spacer layer comprises polysilicon/$SiO_2$. The spacer layer 118 is then patterned utilizing a photolithography process (not shown) and an etch process is performed to remove a portion of the spacer layer 118 and thereby form air gap 120 and metal contacts 121(a), 121(b), while leaving the spacer layer 118 at least partially around a perimeter of the protective region 116(a), 116(b) and exposing the protective region 116(a), 116(b), as illustrated in FIG. 1F.

Figure 1G:
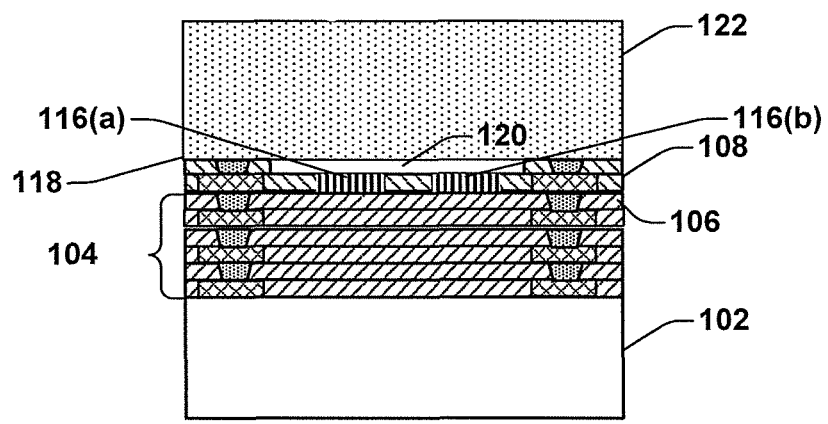

Following etching, a bulk silicon or MEMS device layer 122 is formed over the spacer layer 118 and dielectric layer 108, as illustrated in FIG. 1G. In one embodiment, the bulk silicon layer 122 is a doped silicon (Si) layer. In one embodiment, the bulk silicon layer 122 may include a bonded silicon on insulator (SOI) substrate. The bulk silicon layer 122 may be crystalline Si or poly Si. In alternative embodiments, the bulk silicon layer 122 may include a compound semiconductor such as silicon carbide, gallium arsenide, indium arsenide, and indium phosphide. In one embodiment, the bulk silicon layer 122 is fusion bonded to the spacer layer 118. The bonding process parameters will depend on metal pattern density and material properties. In one embodiment, a typical bonding temperature is approximately room temperature, for example 20° C., to approximately 200° C. Bonding force may be less than 5 kN and bonding time may be less than 10 minutes. However, it will be understood that other parameters may be used for bonding.

Figure 1H:
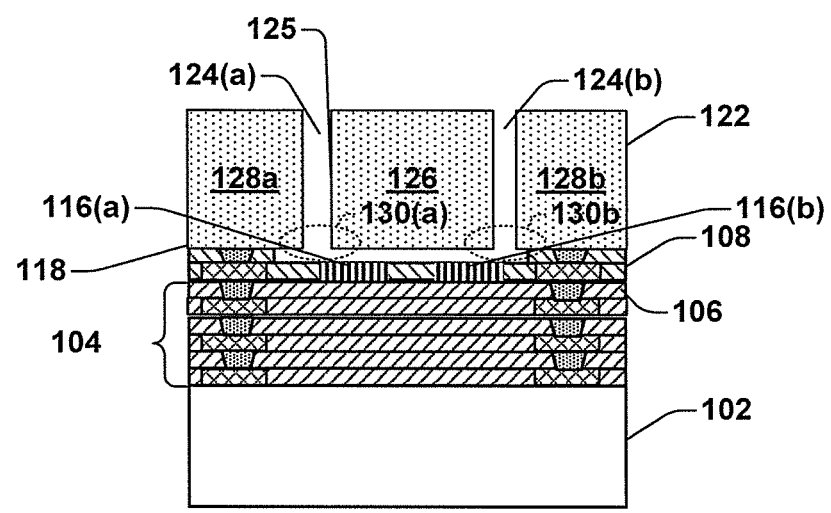

In FIG. 1H, the bulk silicon layer 122 is etched to form recesses 124(a), 124(b) which meet and include the air gap 120 and form suspended body 126. In one embodiment, etch process includes patterning a photolithography mask to define the desired etch pattern, such as defining the recesses 124(a), 124(b). In one embodiment, the etch process performed on the bulk silicon layer 122 includes a deep reactive ion etch (DRIE). It will be understood that the DRIE process may include an anisotropic etching process capable of forming deep holes and recesses. The DRIE process may include cryogenic or Bosch etching processes.

Notably, in the configuration of FIG. 1H and other configurations discussed herein, the protective layer 116a, 116b helps to limit backscattering of plasma ions that are used to form recesses 124(a), 124(b). If the protective layer were not in place, upon etching through the bottom of the recesses 124a, 124b and after meeting the air gap 120 (i.e., during any overetching), the plasma ions would strike the surface of dielectric layer 108 (which has a first backscattering characteristic) and some percentage of the ions would backscatter and strike the undersides of the suspended body 126 and support structures 128a, 128. This undesired backscattering of plasma ions can erode corners of the bulk silicon in areas 130a, 130b. To limit this undesired backscattering, the protective layer 116a, 116b, which has a second backscattering characteristic that limits backscattering relative to that of the dielectric layer 108, is formed under or near the suspended body 126, and therefore helps to limit damage to the undersides of the bulk silicon.

As illustrated in FIG. 1H, protective region 116(a), 116(b) is disposed, in one embodiment, below suspended body 126 and extending past an inner perimeter 125 of suspended body. It will be appreciated, however, further embodiments for placement of the protective region 116 are possible, and are discussed below with reference to FIGS. 2B-2D. These embodiments may provide various levels of protection against backscattering and accordingly limit damage of the bulk silicon layer due to the plasma etch.

Figure 2A:
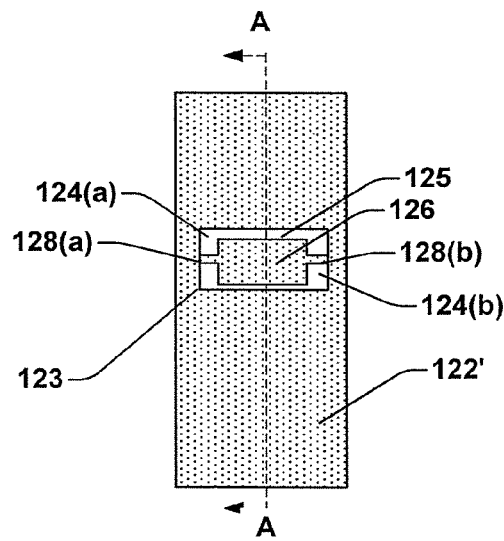
FIGS. 2A-2E are top views of FIG. 1H illustrating some embodiments of a device in accordance with the disclosure.

FIG. 2A illustrates a top view of FIG. 1H through in which etching of the bulk silicon layer 122 forms a suspended body 126 arranged in recesses 124(a), 124(b) having a first or outer perimeter 123. Suspended body 126 is defined by a second or inner perimeter 125. Suspended body 126 is supported by at least one support arm 128(a), 128(b) to couple the suspended body 126 to the support structure 122' formed from bulk silicon layer 122 overlying dielectric layer 108 and suspended over protective region 116.

Figure 2B:
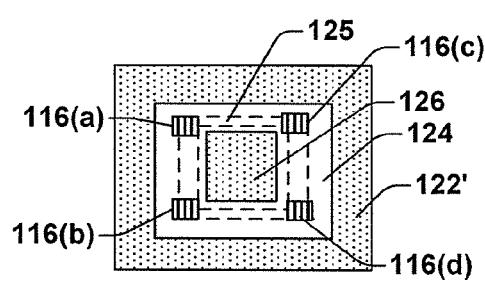
Figure 2C:
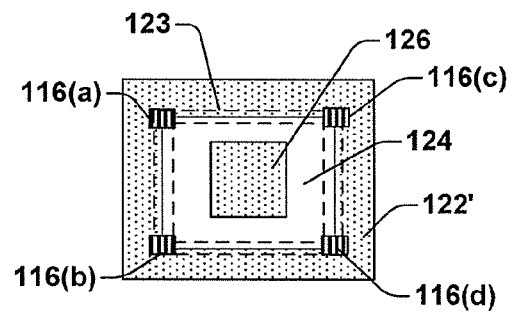
Figure 2D:
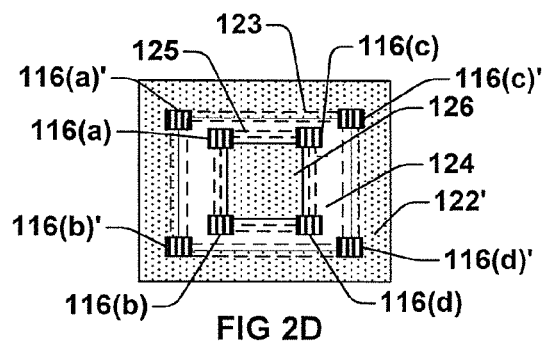
Figure 2E:
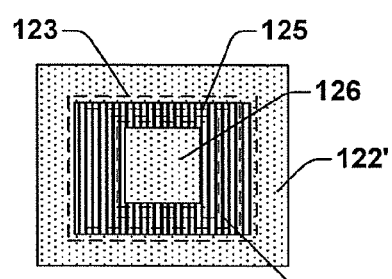

FIG. 2B illustrates an embodiment of protective region 116 in which protective regions 116(a), 116(b), 116(c), 116(d) are disposed at edges of second or inner perimeter 125 of suspended body 126, extending past edges of inner perimeter 125, as illustrated by dashed lines. In another embodiment, as illustrated in FIG. 2C, protective regions 116(a), 116(b), 116(c), 116(d) may be disposed at edges of first or outer perimeter 123 of support structure 122'. In a further embodiment, it is contemplated that protective regions 116(a)-116(d) and 116(a)'-116(d)', may be disposed at inner 125 and outer 123 perimeters, as illustrated in FIG. 2D. It will be understood that in embodiments 2B-2D that protective region 116 will always extend past an edge of inner or outer perimeter at a distance of from about 0.01 to about 0.5 microns. In a still further embodiment, as illustrated in FIG. 2E, protective region is contiguous with inner 125 and outer 123 perimeters.

Figure 3:
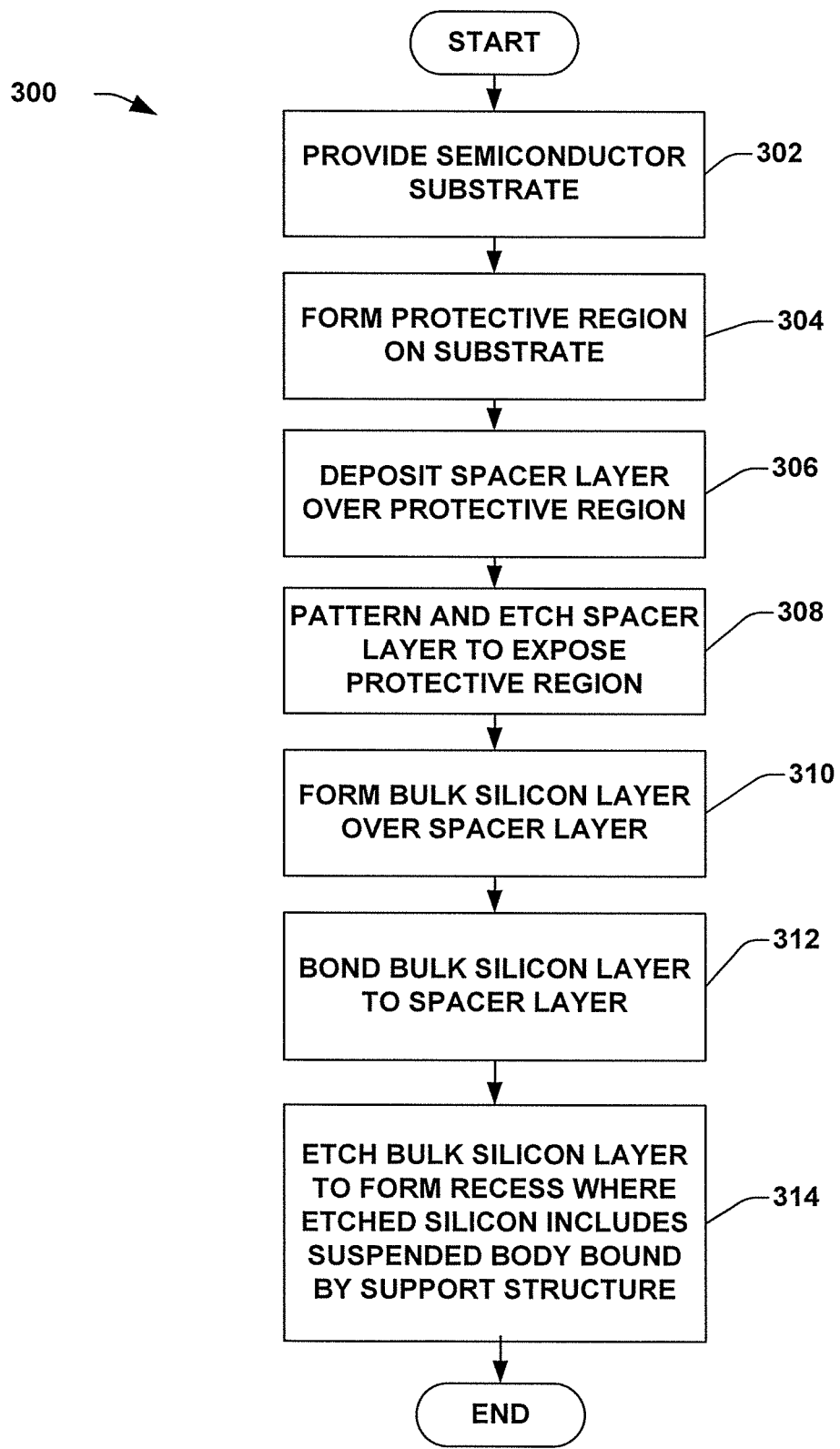
FIG. 3 illustrates a flow diagram of one embodiment of a method for the fabrication of a device in accordance with the disclosure.

FIG. 3 illustrates a flow diagram of some embodiments of a method 300 for formation of a semiconductor structure according to an embodiment of the invention. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a semiconductor substrate is provided. Substrate can include an interconnect structure thereon. A protective region is formed overlying the substrate at step 304.

At step 306, a spacer layer is deposited over protective region.

At step 308, the spacer layer is patterned and etched to remove spacer layer at least partially, leaving a portion of spacer layer around a perimeter of the protective region, while exposing the protective region.

At step 310, a bulk silicon layer is formed over the spacer layer. The bulk silicon layer is then fusion bonded to the spacer layer, leaving an air gap between the protective region and the bulk silicon layer at step 312.

At step 314, the bulk silicon layer is etched to form a recess which meets the air gap. The etched silicon layer includes a suspended body bounded by a support structure and couple to the support structure by support arms. The method then ends.

Therefore, this methodology provides a MEMS device having a protective region which diminishes backscattering of plasma oxide and eliminates silicon bottom damage to the bulk silicon substrate during the DRIE process.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a device including a semiconductor substrate layer having a support structure formed thereon, with the support structure including a recess therein, and the recess having a first perimeter. The device further includes a suspended body arranged in the recess, the suspended body having a second perimeter. The device further includes at least on support arm to couple to the suspended body to the support structure, and a protective region below the suspended body and disposed at an edge of the first or second perimeter, a portion of the protective region extending past the edge of the first or second perimeter.

The disclosure further relates to a method of forming a device comprising providing a semiconductor substrate and forming a protective region on the substrate. The method further includes depositing a spacer layer over the protective region and then patterning the spacer layer to leave the spacer layer at least partially around a perimeter of the protective region while exposing the protective region. The method further includes forming a bulk silicon layer over the spacer layer and bonding the spacer layer to the bulk silicon layer, wherein an air gap is left between the protective region and bulk silicon layer, followed by etching the bulk silicon layer to form a recess which meets the air gap, wherein the etched bulk silicon layer includes a suspended body of bulk silicon bounded by a support structure and coupled thereto by support arms.

The disclosure further relates to a semiconductor substrate layer having an interconnect structure formed thereon and a protective region embedded in a dielectric layer overlying the interconnect structure. The device further includes a MEMS device layer over the dielectric layer, the MEMS device layer comprising a suspended body supported by at least one supporting arm coupled to a support structure and overlying the dielectric layer, the suspended body suspended over the protective region.

What is claimed is:

1. A device comprising:
   a substrate with an interconnect structure disposed thereover;
   a bulk semiconductor substrate arranged over the interconnect structure and including a support structure having a recess therein, the recess having a first perimeter;
   a suspended body fashioned from the bulk semiconductor substrate and arranged in the recess and having a second perimeter;
   at least one supporting arm to couple the suspended body to the support structure; and
   a protective region comprising a metal below the suspended body and disposed at an edge of the first or second perimeter, a portion of the protective region extending past the edge of the first or second perimeter.

2. The device of claim 1, wherein the recess includes an air gap disposed between the suspended body and the protective region.

3. The device of claim 2, wherein the metal of the protective region comprises one or more of Al, AlCu, Ti, TiN, TaN or Cu.

4. The device of claim 3, wherein a thickness of the protective region is from 0.4 microns to 10 microns.

5. The device of claim 4, wherein the protective region extends past the edge of the inner or outer perimeter at a distance of from 0 to 0.5 microns.

6. The device of claim 1, wherein the protective region is disposed at edges of the inner perimeter, at edges of the outer perimeter, or at edges of the inner and outer perimeter.

7. The device of claim 1, wherein the opening between the support structure and the suspended body is formed by deep reactive ion etching.

8. The device of claim 1, wherein the device is configured as an accelerometer that detects a change in position of the suspended body corresponding to an acceleration experienced by the device.

9. The device of claim 1, wherein the protective region is disposed on an exposed upper surface of the interconnect structure and extends continuously between the first and second perimeters.

10. The device of claim 1, wherein a lower surface of the support structure of the bulk semiconductor substrate is bonded to an upper surface of the interconnect structure through a fusion bond.

11. A device comprising:
    a semiconductor substrate having an interconnect structure formed thereon;
    a metal protective region embedded in a dielectric layer overlying the interconnect structure; and
    a bulk MEMS substrate layer over the dielectric layer, wherein the bulk MEMS substrate comprises a suspended body supported by at least one supporting arm coupled to a support structure over the dielectric layer, the suspended body suspended over the protective region.

12. The device of claim 11, wherein the support structure defines a first perimeter and the suspended body defines a second perimeter, the protective region disposed at an edge of the first or second perimeter or contiguous with the first and second perimeter.

13. The device of claim 12, wherein the protective region extends past an edge of the first or second perimeter.

14. A MEMS device comprising:
    a semiconductor substrate having an interconnect structure disposed thereover;
    a bulk MEMS substrate having a support structure and a suspended body disposed thereon; wherein a recess is disposed between the support structure and the suspended body and an air gap separates a lower surface of the suspended body from the interconnect structures;

a protective region disposed on an upper surface of interconnect structure and exposed to the air gap; wherein the protective region is disposed directly under a perimeter edge of the suspended body.

15. The MEMS device of claim 14, wherein the protective region laterally extends under the suspended body at a distance of from 0 to 0.5 microns.

16. The MEMS device of claim 14, wherein the protective region laterally extends to the recess at a distance of from 0 to 0.5 microns from an outer perimeter of the suspended body.

17. The MEMS device of claim 14, wherein the protective region laterally extends under both the suspended body and the recess.

18. The MEMS device of claim 14, wherein the protective region comprises a same metal as conductive regions of the MEMS devices.

19. The MEMS device of claim 14, wherein the protective region comprises Al, AlCu, Ti, TiN, TaN, Cu or the combination thereof.

20. The device of claim 14, wherein a lower surface of the support structure of the bulk silicon MEMS substrate is bonded to an upper surface of the interconnect structure through a fusion bond.

* * * * *